US005165015A

United States Patent [19]
Coggins

[11] Patent Number: 5,165,015
[45] Date of Patent: Nov. 17, 1992

[54] ELECTRONIC TEMPLATE SYSTEM AND METHOD

[75] Inventor: Edward W. Coggins, Greenville, S.C.

[73] Assignee: Reliance Electric Industrial Company, Greenville, S.C.

[21] Appl. No.: 412,137

[22] Filed: Sep. 25, 1989

[51] Int. Cl.$^5$ ............................................. G06F 15/60
[52] U.S. Cl. .................................. 395/155; 395/161; 364/512
[58] Field of Search ............................. 364/518–521, 364/512, 488, 578, 200, 900; 340/723, 727, 734

[56] References Cited

U.S. PATENT DOCUMENTS 4,181,954 1/1980 Rosenthal et al. .............. 364/512 X
4,813,013 3/1989 Dunn ............................. 364/521 X Primary Examiner—Heather R. Herndon
Assistant Examiner—Almis Jankus
Attorney, Agent, or Firm—Dority & Manning

[57] ABSTRACT

An electronic template includes components stored with corresponding dimensional data. Each component is assigned an insertion point by which a user may interface with a computer-aided design operating system for indicating the desired position and rotational orientation of a selected component. First selected components comprise primary components, and typically have further accessory attachment points designated thereon, whereby subsequent accessory components may be automatically connected in the design to its primary component with which it mates. The accessory attachment point defines a target for insertion of the accessory component, thereby maintaining positional accuracy without requiring the user to determine positioning relationships for mating parts. Once entered into the design, the user may draw on the component dimensional data for calculating dimensions on the drawing.

29 Claims, 8 Drawing Sheets

| DMR |
|---|
| 1ST-LINE |
| |
| APG CFAC |
| C-F MTR |
| GRIDLIGN |
| PARAFLEX |
| S2000 FL |
| S2000 PB |
| SAF-XT |
| SC PB |
| SC2B FLG |
| SC4B FLG |
| SCD MM |
| SCM PB |
| SCXT |
| MNT ACC ← 110 |
| |
| -NEXT- |
| -END- |

Fig. 4A

| DMR |
|---|
| 1ST-LINE |
| ← 110 |
| APG CFAC |
| C-F MTR |
| GRIDLIGN |
| PARAFLEX |
| S2000 FL |
| S2000 PB |
| SAF-XT |
| SC PB |
| SC2B FLG |
| SC4B FLG |
| SCD MM |
| SCM PB |
| SCXT |
| MNT ACC |
| |
| -NEXT- |
| -END- |

Fig. 4B

| DMR |
|---|
| 1ST-LINE |
| NEMA C-F |
| MOTORS |
| FCXP-3P ← 110 |
| |
| PROT-1P |
| |
| PROT-3P |
| |
| TEFC-1P |
| |
| TEFC-3P |
| |
| TENV-1P |
| |
| TENV-3P |
| -PREV- |
| -NEXT- |
| -END- |

Fig. 4C

| DMR |
|---|
| 1ST-LINE |
| NEMA C-F |
| MOTORS |
| FCXP-3P |
| |
| 0.75 56 ← 110 |
| |
| 1.00 56 |
| |
| |
| |
| |
| |
| |
| |
| |
| |
| -PREV- |
| -NEXT- |
| -END- |

Fig. 4D

| DMR |
|---|
| 1ST-LINE |
| NEMA C-F |
| MOTORS |
| FCXP-3P |
| 0.75 56 |
| VIEW A ← 110 |
| |
| VIEW B |
| |
| |
| |
| |
| |
| |
| |
| |
| -PREV- |
| -NEXT- |
| -END- |

Fig. 4E

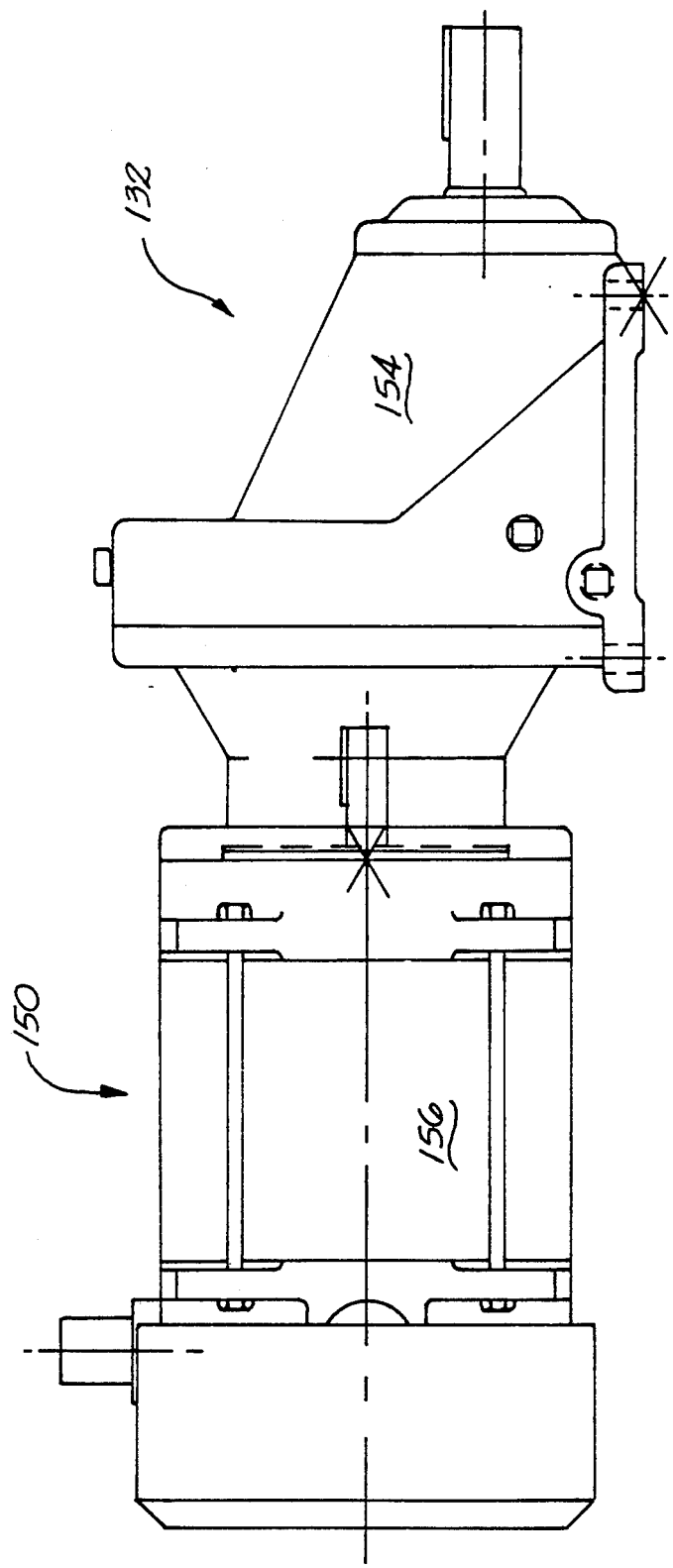

ELECTRONIC TEMPLATE SYSTEM AND METHOD

BACKGROUND OF THE INVENTION

The present invention generally concerns computeraided design systems, and more particularly concerns a system and method for manipulating respective product components during the course of producing a computer-aided design.

With the onset of total pervasiveness of computers, as well as the introduction of personal computers such as the IBM PC, having considerable power and flexibility, usage of computer-aided design (CAD) systems has become commonplace. One particular system which is well known to those of ordinary skill in the art is the "AutoCAD" system, which is a registered trademark of AutoDESK, Inc.

Often times, the task of a design engineer or the like operating a CAD system involves selecting components to be assembled in a given design. Thus, the design will incorporate potentially both "original" drawings of the designer and commercially available components. Frequently, the commercially available components are illustrated and described, with dimensional detail, in catalogs of products from various suppliers. A catalog will typically relate to a family of products or related families of products comprising a particular product type. Within each family, there may be numerous choices, such as to type or size, which must be selected by the designer in the course of the design process.

As typically presently occurs, selection of a commercially available component which is described in a catalog requires transference of the dimensional information of the selected component into the design field of the computer-aided design system. Since the exact placement of component parts in a CAD system is crucial for maintaining accuracy within the design, the need to maintain positional accuracy is self-evident. Likewise, the task of manually transferring dimensional data from the catalog to the computer system can result in a significant time effort, not to mention the prospect of errors during data entry or manipulation. As is well understood to those of ordinary skill in the art, small errors on the design board can manifest themselves as large scale problems at a later time, especially if undetected until such later stages.

The foregoing transference problem is self-evident for even a single component, but real world practicalities are such that there may be dozens, if not in fact hundreds or thousands of potential components from various suppliers which must be considered, and possibly entered into the computer. Thus, the significance of the initial problem is magnified by sheer numbers.

Furthermore, the typical prior art methodology of laying in outside dimensions of a selected component fails to provide internal details of the component structure. In effect, a considerable amount of useful information is left behind "in the catalog," and would be that much more of a burden to enter into the computer, if even possible to do so in a reasonable fashion.

SUMMARY OF THE INVENTION

The present invention recognizes and addresses various of the foregoing problems, and others concerning computeraided design operations. Thus, broadly speaking, a principle object of this invention is to improve computeraided design operations. More particularly, a main object is improved efficiency and accuracy in selecting and manipulating components, such as commercially available products, for introduction into a design being produced with a computer-aided system.

It is therefore another particular object of the present invention to provide both systems and processes for selectively accessing desired components. It is a more particular object for such components to automatically be associated with important dimensional data, which data per further present features may be readily introduced into the computer-aided design, and thereafter manipulated together with information regarding subsequent components.

It is another general object of the present invention to provide for the automatic entry of selected components into a design field, once selected and specified by a user through practice of the present invention. It is a more particular object to provide for similar efficient and effective introduction of accessory components into the design field.

It is yet another general object of this invention to provide improved systems and processes by which an accessory component may be automatically mated in the proper location and orientation with a corresponding primary component. It is a more particular object to provide improved computer-aided design systems and processes which assist the designer by restricting the selection of impractical primary/accessory component combinations.

It is yet another present object to provide an electronic template system and method, which not only facilitates selection and introduction of desired components into a design being produced with a computeraided design system, but which provides automatically for the transference to such design of detailed dimensional data, including, for example, both exterior and interior details of the component.

It is another general object of the present invention to provide an electronic template system and process which can obviate the need for numerous product catalogs and the detailed dimensional data therein, and particularly as such data relates to numerous details for variations in sizes and types within a given family of products. It is a more particular object to provide such an improved electronic template system and process which permits subsequent extraction of such dimensional information if desired between selected points, after the design is produced with aid from practice of the present invention.

Additional objects and advantages of the invention are set forth, or will be apparent of those of ordinary skill in the art, from the detailed description which follows. Also, it should be appreciated that modifications and variations to the specific illustrated and discussed features and steps hereof may be practiced in various embodiments and uses and applications of this invention, without departing from the spirit and scope thereof, by virtue of present reference thereto. Such variations may include, but are not limited to, the substitution of equivalent means, features, or steps for those shown or discussed, and the reversal of various parts, steps, or the like.

Still further, it is to be understood that different embodiments, as well as different presently preferred embodiments of the present invention may include various combinations of presently disclosed features, or their equivalents (including combinations not expressly shown or stated). One exemplary such embodiment of the present invention relates to a process for operating a computeraided design system, such as having microprocessor means, memory means, and monitor means for producing designs in a given design field. Such process preferably comprises storing in the memory means a plurality of respective product components for possible use in a given design produced within said given design field, including assigning a predesignated CAD insertion point on each respective component; specifying to the microprocessor means a particular respective product component to be extracted from the memory means; indicating a field point within the design field where the CAD insertion point of the specified product component is to be inserted into the design being produced; determining a rotation angle for the specified product component about its CAD insertion point; and thereafter automatically entering the specified product component into the design field, with the CAD insertion point of such specified component positioned in the given design field at the field point indicated therein, and with the specified component rotated at the determined rotation angle about its CAD insertion point. With such process, a desired product component may be selected and automatically positioned within the design being produced in the given design field with minimized user manipulations. The present invention encompasses a corresponding computeraided design system.

In practicing the foregoing process, further alternative aspects of present embodiments may include assignment to each primary component representation an accessory attachment point thereon, and subsequent attachment thereto of a stored accessory component representation also selected through practice of the present invention. Such accessory component representation may likewise have a CAD insertion point predesignated in accordance with the present invention, which is efficiently mated to the primary component accessory attachment point, which acts as a precoded target means for such accessory component representation.

Another present exemplary embodiment concerns an electronic template system for aid in producing computergenerated designs, comprising an electronic catalog of information concerning primary components for selected usage in a design being produced, such catalog including a graphics form representation and corresponding dimensional data for each respective primary component and the location of a predefined insertion point on each component representation; and microprocessor means, operatively associated with the electronic catalog, for selectively withdrawing primary component information therefrom for use in a given design being produced. Preferably, in such system the microprocessor means is operative for being commanded by the user so as to select a desired primary component, and thereafter automatically enter representation of same into the design, with such desired primary component representation entered with the predefined insertion point thereof located at a user-designated point in the design, and with such desired primary component representation situated in a user-designated rotation about its predefined insertion point.

This invention is also intended to encompass a corresponding method of operating an electronic template system.

Also, such electronic template embodiments may include a further alternative present embodiments for practice of the present features noted above with reference to automatic mounting and mating of accessory components to previously entered primary components.

Yet another construction comprising an exemplary embodiment includes an automatic component-matching design assistance system for operation within a computer process comprising a computer-aided design system including microprocessor means, for producing a design within a design field. Such design assistance system preferably includes such an electronically stored catalog of a plurality of graphics form representations of respective primary components and accessory components with dimensional data stored for each of the respective components, and with a predefined insertion point assigned on each component representation, and a predefined accessory attachment point assigned on each accessory component representation; and means operative with the microprocessor means and under user direction for selecting from the catalog a desired respective primary component, and entering same into the design field with the predefined insertion point of such primary component representation situated at a user-designated position in the design field, and with the primary component representation oriented at a user-designated rotation angle about its predefined insertion point.

A design assistance system such as the foregoing may further include means operative with the microprocessor means and under user direction for selecting from the catalog a desired respective accessory component, and for entering the selected accessory component representation into the design field with the location of the predefined insertion point of such accessory component representation automatically mated to the predefined accessory attachment point of the primary component representation, and with a predetermined rotation angle between such component representations.

Further embodiments of the present invention may, for example, be directed to computer processes corresponding to the foregoing design assistance systems.

Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the remainder of the specification, which makes reference to the appended figures in which;

FIGS. 4A, 4B, 4C, 4D, and 4E are progressive exemplary representations which may be made to a user during practice of certain embodiments or aspects of the present invention, particularly in connection with automatic entry into a design of a selected accessory component;

FIG. 7 is an exemplary representation of a primary/accessory component combination (for example, the components shown separately in present FIGS. 5 and 6), automatically mated in accordance with practice of the present invention;

Figure 1A:
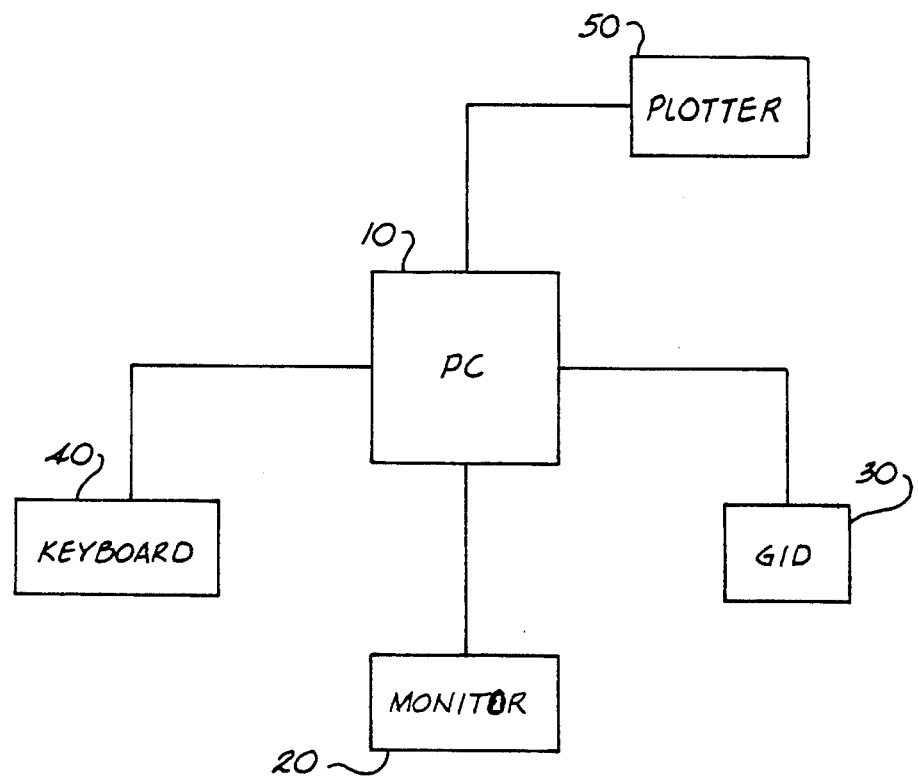
FIG. 1A is a generalized block diagram of a computeraided design system which may comprise an embodiment of this invention, or which may be operated in accordance with the present invention.

Repeat use of reference characters throughout the present specification and appended drawings is intended to represent same or analogous features or elements of the invention.

DETAILED DESCRIPTION OF THE PREFERRED EMBODIMENTS

Those of ordinary skill in the art will readily appreciate that the following exemplary embodiments are for the purpose of disclosing operative embodiments and alternatives of the invention without limiting the broader spirit and scope thereof. For example, present FIG. 1A in representational block diagram format shows a particular hardware configuration which may be used for computeraided design. In broad general terms, a PC 10 may be used such as the IBM PC XT or AT, or equivalents thereof. Monitor means 20, such as a CRT or similar device, permits the system user to observe production of a design in a given design field. Such design may encompass the screen of the CRT, or a larger "field," such that only a portion of such field may be viewed at a time with the CRT. Graphics input device 30 and keyboard means 40 permit the system user to control production of a design. The format and function of keyboard 40 is fairly standardized and well known. Graphics input device 30 may comprise various different devices, such as a mouse, a three-button mouse, or an electronic tablet and light pen or stylist. Of course, a system configuration could be operated without requiring both keyboard 40 and graphics input device 30, with either one instead being used by itself. Likewise, plotter 50 comprises or amounts to an optional device, but is typically present to provide output means for outputting a hard copy drawing of the design being produced within the design field. Such plotter may assume numerous different forms and types for accomplishing such output means function.

The foregoing respective hardware components of FIG. 1A, in general terms only, are respectively well known to those of ordinary skill in the art. Hence, additional details thereof are not presently required for a complete and enabling understanding of the present invention, aside from the following description of present embodiments, which may be practiced in association generally with a configuration such as of present FIG. 1A. Preferably, for purposes of more complete representations and discussion of the present invention, reference is made hereinafter to the system configuration of FIG. 1B which separately represents memory means apart from the PC or microprocessor 60. It is also noted that the communication lines between the components of present FIGS. 1A and 1B for the sake of clarity in such illustrations do not include directional arrows, since it is well understood by those of ordinary skill in the art that communications of various types and formats may at various times flow in either direction along such communication paths.

Figure 1B:
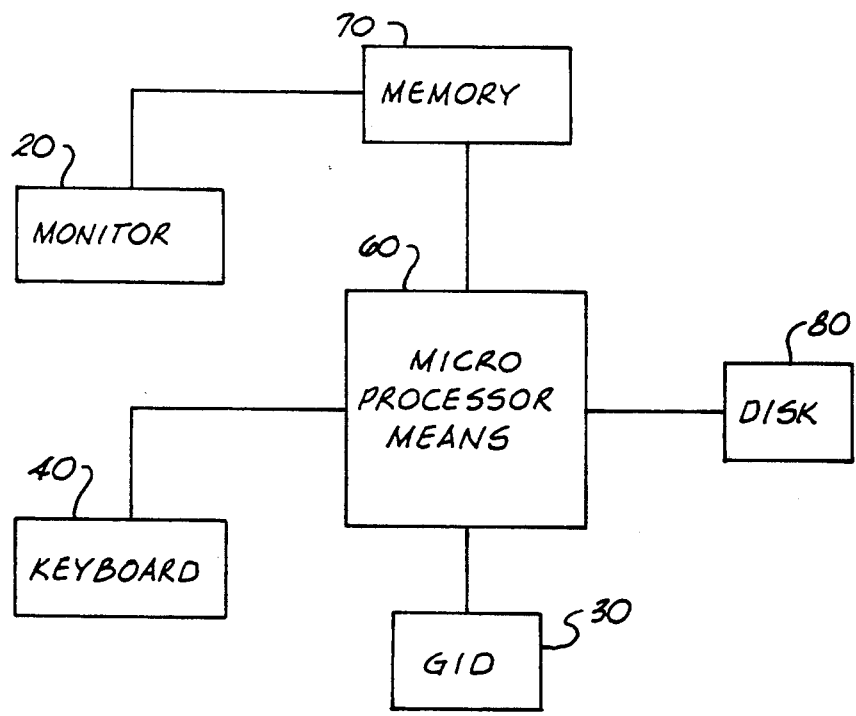
FIG 1B is a slightly more particularized block diagram of components comprising a computer-aided design system which may comprise an embodiment of this invention, or which may be operated in accordance for practice of the present invention.

In present FIG. 1B, a more particularized block diagram of a system configuration for producing computergenerated designs is illustrated. The general presentation of PC 10 is replaced with a more particular representation of a microprocessor means 60. Specific representations of memory means are provided by a disc 80 and separate memory 70. In the sense that certain aspects of the present invention relate to an electronic template system or the like, disc 80 may represent an electronic catalog of information, such as concerning components for selected usage in a design being produced. Such catalog may include dimensional data for each respective component. Moreover, separate information may be kept on components regarded as primary components, and other components regarded as accessory components for mating and/or other forms of matching with such primary components. In further, more particular aspects of the present invention, the information stored concerning such components further includes the location of a predefined CAD insertion point on each such component. The purposes and functions of such will be more clear from the remainder of the present specification, but generally such preassignment in association with practice of the present invention permits extremely efficient manipulation of component data, as well as graphic representations thereof.

One practicing the present invention, for example utilizing a system configuration as represented in present FIG. 1B, may operate the keyboard 40 and/or graphics input device 30 so as to cause microprocessor means 60 to retrieve specific component information from disc 80. Once such information, or a block of information concerning related components, is extracted it may be stored and/or manipulated in a relatively "more active" memory, such as memory 70. In general, it is possible to practice the present invention "within" a larger or main computer process comprising a computer-aided design system, such as AutoCAD (a trademark of AutoDESK, Inc.). Necessary hardware, such as a standard IBM PC, and other supporting hardware for operating such a CAD system, is well known and understood by those of ordinary skill in the art. Operation of the present system, such as an electronic template system for aid in producing computer-generated designs, or as a design assistance system for operation within a computer process comprising a CAD system, is set forth in greater detail hereinafter.

Figure 2:
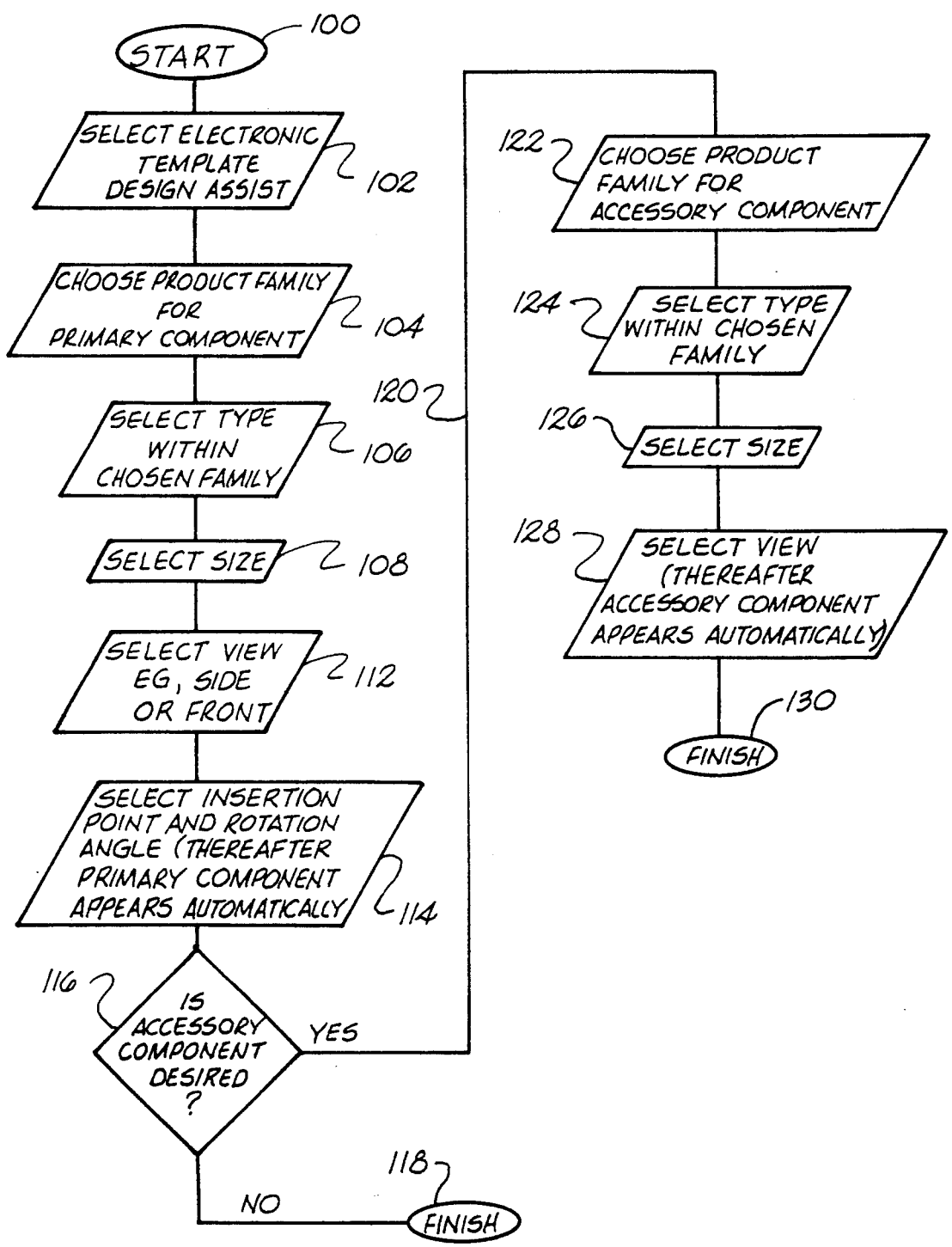
FIG. 2 is a representational flow chart of an exemplary present process for improved computer-aided design in accordance with this invention.

Present FIG. 2 comprises a representational flow chart of a generalized process or method in accordance with this invention. In fact, such figure includes certain details to which broader aspects of the present invention would not necessarily be limited. The flow chart of FIG. 2 is also primarily from the perspective of the system user (i.e., person practicing the present invention). Certain other details of various aspects of the present invention are discussed below with reference to FIGS. 8 and 9. During the course of the following discussion of present FIG. 2, reference is also made to FIGS. 3A through 3F, 4A through 4E, and 5 through 7.

In accordance with certain aspects of the present invention, components stored in memory means are efficiently selected and entered into a design being produced within a given design field. Such activity preferable includes transmission of detailed dimensional data for such component, as well as a predefined CAD insertion point as discussed in greater detail hereinafter.

Figures 3A, 3B, 3C:
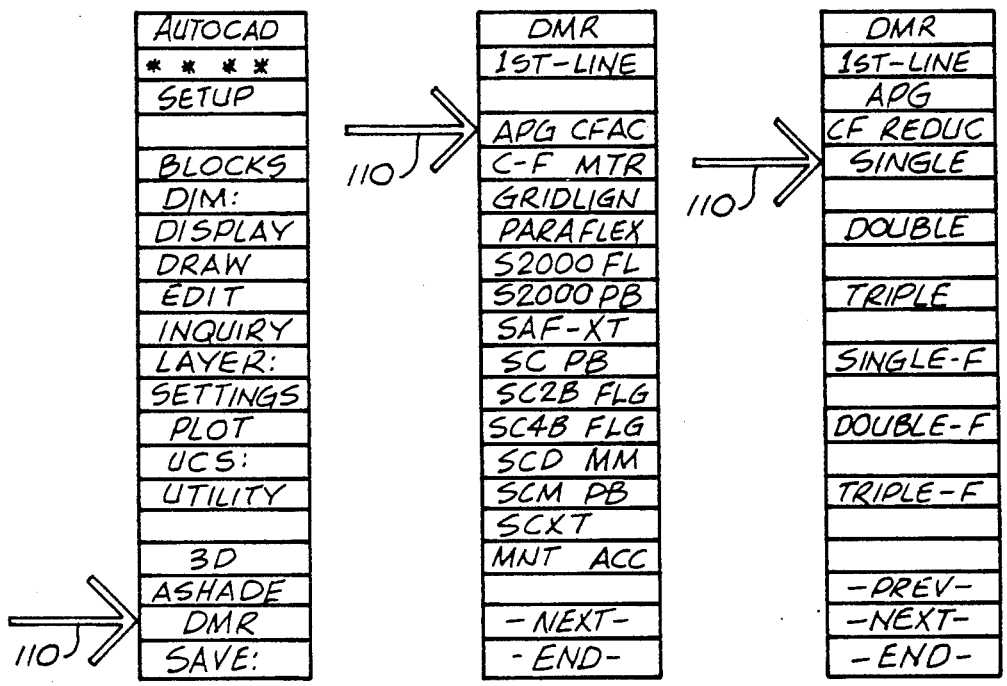
FIGS. 3A, 3B, 3C, 3D, 3E, and 3F are progressive exemplary representations which may be made to a user during the course of practicing certain embodiments or aspects of this invention, and particularly in connection with automatic entry into a design of a selected primary component.
Figures 3D, 3E, 3F:
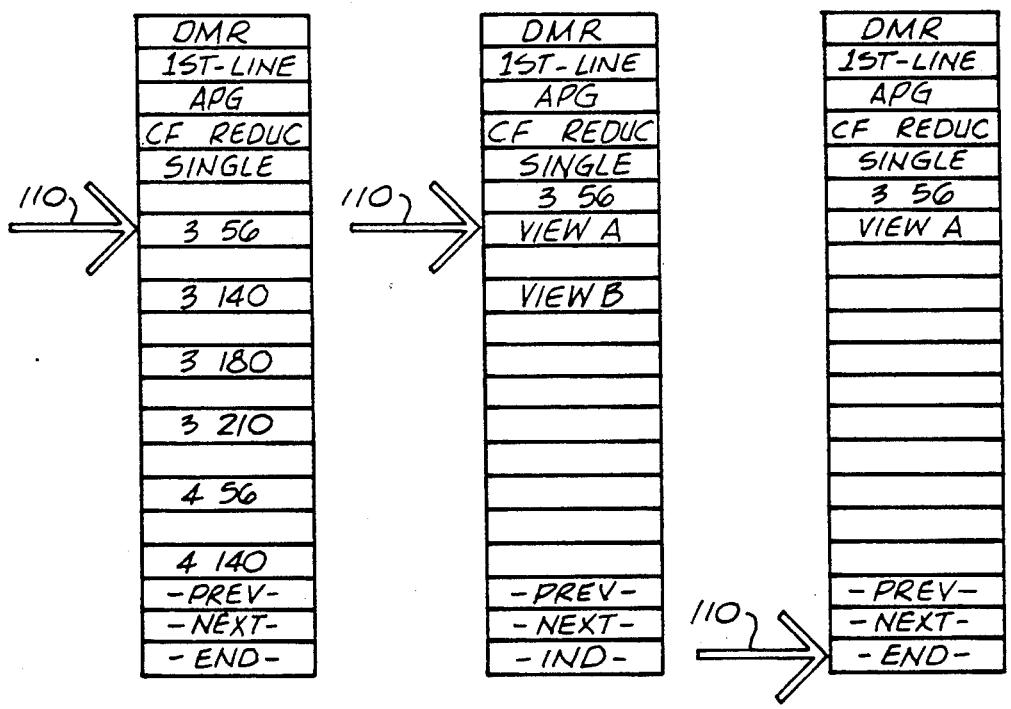

With reference to present FIG. 2, for purposes of start point 100, it may be assumed that a system operator is possibly otherwise operating within a computer-aided design system such as AutoCAD. During such design process, the user, such as a design engineer working on a power transmission design, may require the addition of various commercially available components to the design. Such components could comprise a variety of products, as well as a variety of types, sizes, etc., within a given product. Exemplary products may comprise gearmotors, reducers, mounted ball and roller bearings, conveyor components, shaft coupling components, fractional horsepower motors, and others. Instead of searching catalogs to determine availability and specifications of component alternatives, the system user may select electronic template design assist, step 102 of present FIG. 2. Such step is represented by the menu selection illustrated in present FIG. 3A. The initially indicated menu of present FIG. 3A is substantially a menu as would appear in AutoCAD, just as a user exits such for entry into the practice of the present invention. The series of figures comprising present FIGS. 3 and 4 generally present a series of possible menus which may appear on a user's monitor means throughout various stages of practice of the present invention. Of course, such are not limiting to the present invention and are merely examples of how a particular embodiment may be practiced. Moreover, it is not strictly necessary that practice of the present invention include operation and use of a monitor means, though such is generally preferred for greatest efficiency and user friendliness.

In present FIG. 3A, control arrow 110, such as directed by a mouse or other instrumentality, is used to operate microprocessor means 60 for practice of the present invention, referred to therein as line item "DMR." In this instance, "DMR" refers to DODGE, MASTER, REEVES, trademarks and/or trade names of the present assignee. Once so activated, the next step in the exemplary method or process of this invention relates to specifying a component which is desired for inclusion in the design being produced within the given design field. Such may include very simply selection from a few components. However, in order to receive increasing benefits from the present invention, it is generally preferred that information regarding relatively larger numbers of components be stored in the memory means or electronic catalog in accordance with the present invention. In such case of larger numbers of components, a plurality of steps may be practiced for selecting first a family of products, followed by selection of type and size of a particular component for entry into the design being produced.

Step 104 in present FIG. 2 and the representation of present FIG. 3B illustrates selecting from the memory means a family of related components, which family preferably includes a plurality of respective components of differing types and/or sizes within such family. In the specific example being followed herewith, pointer 110 in present FIG. 3B is representing selection of an APG C-face reducer. Further in accordance with the present example, once the product family as selected, a subsequent menu as represented in FIG. 3C may be provided to permit the user to select a component type within the chosen family. As represented in present FIG. 3C, pointer 110 is being conveniently utilized to specify a single reduction APG C-face reducer.

Of course, regarding present terminology insofar as components, their types, and other characteristics is concerned, all such terminology is by way of example only directed to those of ordinary skill in the art in connection with power transmission design. The present invention is not limited to application of designs in the area of power transmission, and it is to be understood that examples of the invention directed to other design applications could involve vastly different terminology which would be only fully comprehended by those of ordinary skill in such other arts. Since the present invention is generally without limitation as to the field of design, no effort is made herewith to exhaustively list the various possibilities, such as designs in the area of heating and cooling systems, electrical systems, plumbing systems, steam generation systems, hydraulic systems, etc.

Further following the present example from a user perspective of practicing one embodiment of this invention, step 108 of present FIG. 2 involves selecting the size of the type of component chosen. As represented in present FIG. 3D, pointer 110 is being used for choosing a size 3 APG with a 56 C-face input. Again, it is not necessarily intended that the specific exemplary terminology used herewith is well known outside the area of power transmission design.

Still further aspects of the present invention involve the storage of different selectible views of each individual component, selection of which is otherwise fully designated upon specifying a product family and a type and size component within such family. Step 112 of present FIG. 2 represents selection of a particular view. As represented in present FIG. 3E, generally at least two views are available. Pointer 110 indicates selection of arbitrarily established view "a" which in the present example is a side view. View "b" is arbitrarily assigned as a front view. Other views and designation schemes therefor may be practiced in keeping with this invention.

After completion of the foregoing steps to specify the respective component, and the desired view thereof (which steps may vary in different embodiments of the present invention), the user interacts with microprocessor means 60 to indicate a particular point within the given design field where the specified component is to be entered. In particular, the utilization of the assigned predesignated CAD insertion point on each respective component permits very efficient operation of the design assistance system. A user may designate the point of insertion, and an angle of rotation of the component about its respective CAD insertion point. Thereafter, operation of the present invention permits automatic entry of the selected component into the design being produced, with the CAD insertion point of such component placed co-existent with the indicated point of insertion, and with such component automatically rotated to the angle designated. Such selection of insertion point and rotation angle is represented in step 114 of present FIG. 2.

Of course, variations may be practiced. For example, absent an alternative indication from the user, a rotation angle may be established as standard, and practiced unless and until the user indicates a different rotation angle. Such "standard" rotation is intended as included when reference is made to "determining" a rotation angle in accordance with the present invention. Accordingly, such "determining" is intended as referring to a determination made by a system user, or by the system itself as a matter of standard protocol.

As a further aspect of the present invention, the foregoing component selection and automatic entry aspects of this invention may be practiced together by themselves in given present embodiments. However, to gain further efficiencies in manipulating components, the selected component may be from a grouping of components predesignated as "primary" components, to which it is intended that one or more "accessory" components are to be mated. If no accessory component is desired, i.e., the "no" result from decision point 116 of present FIG. 2, then the system may be exited such as at step 118, or return to the larger computer process, if any, comprising a CAD system or the like. Generally, any manner of exit may be practiced, such as by selecting "end" twice with point 110 as represented in present FIG. 3F. A "yes" result to the question point 116 results in subsequent functions which may be generally referred to as mounting an accessory component to the entered primary component. In such situation, the primary component, once entered, becomes part of the design drawing in situ, and manipulation of the accessory component thereafter does not affect the primary component and its relationship to any other features of the design being produced, which may already be entered into the design field. Such mount accessory function is discussed in greater detail with reference to pathway 120, et seq., of FIG. 2, and the exemplary menu indications of present FIG. 4A through 4E. However, a greater appreciation of the present invention may be obtained by first considering the exemplary illustrations of present FIGS. 5 through 7.

Figure 5:
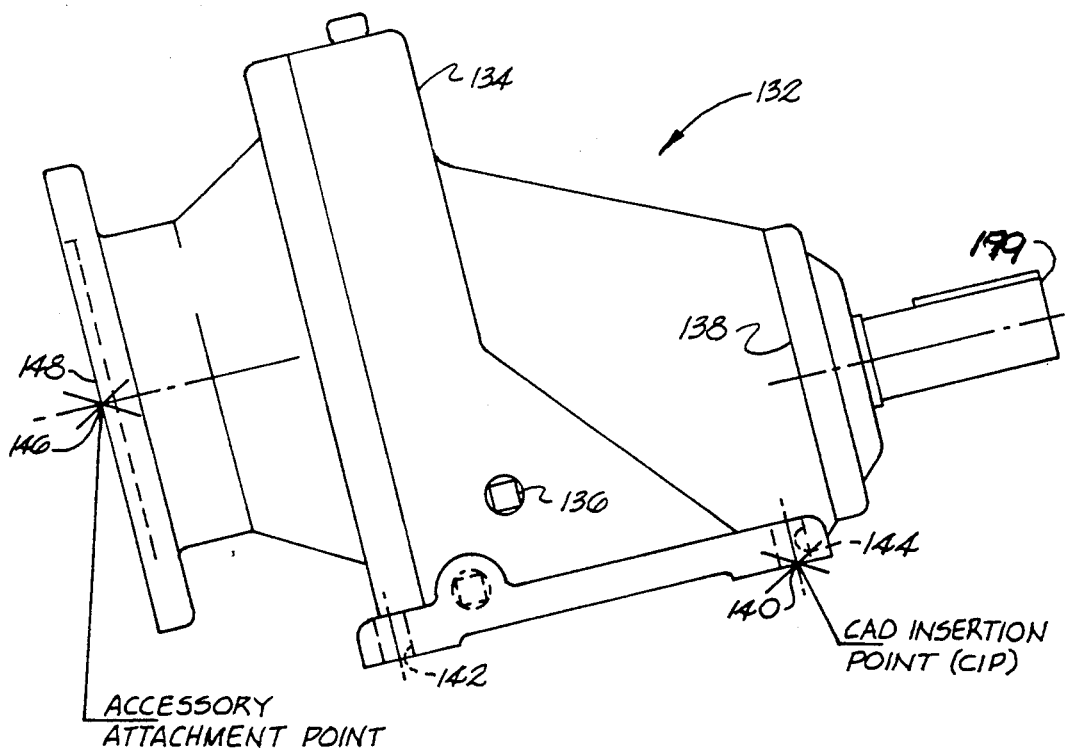
FIG. 5 is an illustration of an exemplary primary component (side view) which may be selected in accordance with this invention and entered into a design.

With reference to present FIG. 5, an exemplary primary component 132 is illustrated. Such component may comprise an APG C-face reducer, as specified throughout the foregoing example with reference to steps 102 through 114 of present FIG. 2, and with reference to present FIGS. 3A through 3E. The side view of present FIG. 5 also represents the detailed dimensional data which is preferable automatically extracted from memory means (or an electronic catalog) and entered into the design field, and which advantageously may include both external details such as exterior 134, as well as internal details such as 136 and 138. Transference of all such details greatly facilitates initial selection and subsequent manipulation of component information, including accurate dimensional data therefor.

Automatic entry of such component into the design being produced within the given design field is efficiently effected in accordance with the present invention through utilization of the preassigned CAD insertion point 140, as represented by the "cross-hair" indication in present FIG. 5. Such point is preferably predefined on the component at a position which bears some logical relationship to the function of such component within the given field of design. For example, the reducer shown is typically bolted or otherwise mounted to other surfaces, such as through use of bolt holes 142 and 144. Hence, since personnel involved with power transmission are already familiar with considering the placement of such mounting plate for reducer 132, the CAD insertion point is preferably logically and advantageously selected to be placed on such mounting plate. The present invention is not limited to inclusion of a CAD insertion point at any particular location so long as it is designated and located at some point on the component, and such information is maintained in association with the component.

After selection of a point within a given design field (i.e., a filed point) where the CAD insertion point predesignated on component 132 is to be entered, a rotational angle of such component about its respective CAD insertion point may be indicated, whereafter the present invention is operative for automatically entering component 132 into the given design field, with its CAD insertion point co-existent with the indicated point within such field(i.e., indicated filed point), and with the indicated rotational orientation therefor also automatically entered.

In order to facilitate characterization of particular components as primary components, and to automatically mate therewith subsequent accessory components, preferably an accessory attachment point 146 is likewise assigned and stored with other information regarding each respective component in the electronic catalog or memory means in accordance with the present invention. Such point 146 functions, in effect, as precoded target means to which an accessory component may be advantageously attached.

As illustrated in the exemplary reducer 132, an accessory attachment point 146 is preferably also logically associated with the function of the component. Since the reducer has a drive input 148 generally and a drive output 149, one or the other of such areas are strong candidates for logical association of an accessory component. In the present example, an accessory attachment point is indicated at the drive input end 148, to facilitate attachment of an accessory component such as a drive motor or the like. As a further aspect of the present invention, it is possible to provide more than one accessory attachment point for a given primary component, and at some intermediate step during operation of this invention, indicate the accessory attachment point to which a selected accessory component is to be mated. Of course, plural respective accessory components could be progressively attached to plural accessory attachment points or targets, instead of attaching a single accessory component to only one point. Circumstances vary with the practicalities of each component, rather than due to any inherent limitations of this invention.

Returning to present FIG. 2, upon following pathway 120, it is assumed that the user desires to select and enter into the design an accessory component. In a manner similar to choosing the product family for the primary component, a product family may be chosen for the accessory component via step 122. Present FIG. 4A indicates selection of this mount accessory feature with pointer 110, which in essence is answering question block 116 in the affirmative. Thereafter, present FIG. 4B represents exemplary selection of a product family comprising a C-face motor.

Following step 122, the type of component within the chosen family is selected in step 124, and as presently represented by FIG. 4C, pointer 110 may be utilized in selecting an exemplary type, such as a fan-cooled explosion-proof motor. Further in a manner similar to the selection process for the primary component, available sizes may be selected from in step 126. Present FIG. 4D represents with pointer 110, indication of specifying a 0.75 horsepower 56 frame C-face motor. In yet another step similar to that in the process for selecting and entering the primary component, a particular view is selected in step 128, and as presently represented in FIG. 4E with pointer 110 is associated with view "A".

Preferably, after selection of such view, all information needed has been provided in order for the present invention to function for automatically entering the accessory component (represented by step 130 "FINISH" in present FIG. 2). Moreover, such accessory component will preferably be automatically mated to the primary component in the manner hereinafter described.

Figure 6:
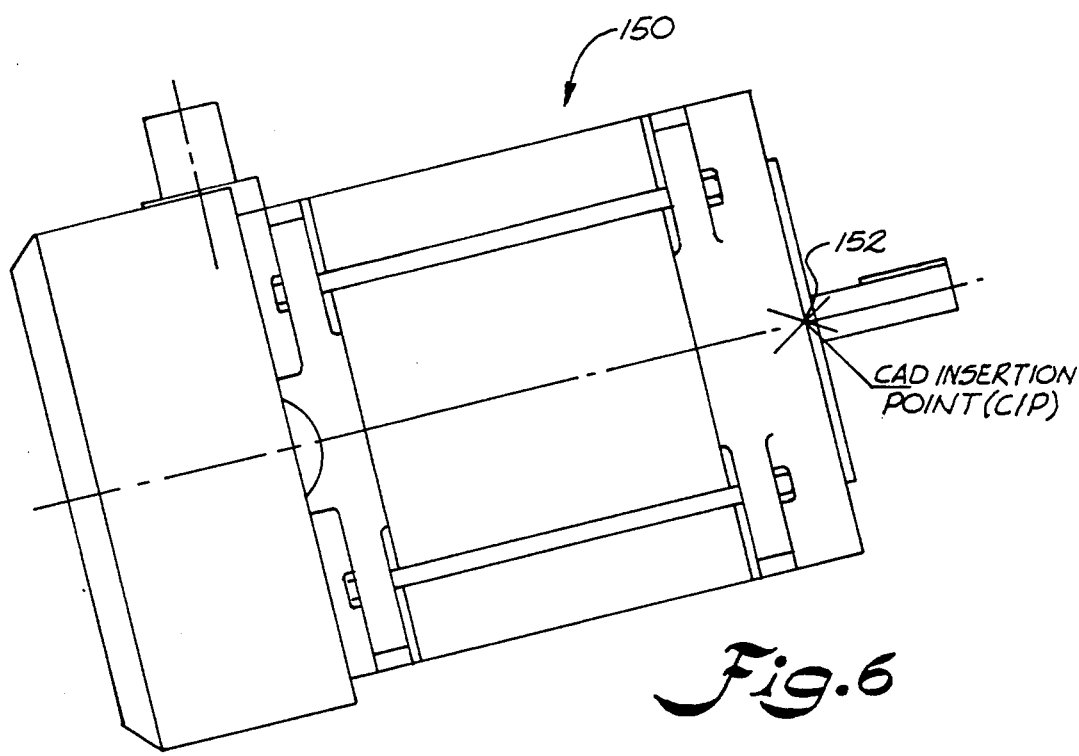
FIG. 6 is an illustration of an exemplary accessory component (side view) which may be selected and automatically entered into a design in accordance with the present invention.

Present FIG. 6 represents the fractional horsepower C-face motor 150 as discussed in the foregoing exemplary accessory component selection process. Just as with any other component for which information is stored in the electronic catalog or memory means in accordance with this invention, detailed dimensional data for component 150 is present and is transferred to the design. Likewise, each component so cataloged in accordance with this invention is provided its own CAD insertion point, and component 150 includes CAD insertion point 152. In accordance with this invention, component 150 is automatically entered into the design being produced within the given design field, with both the external and internal dimensional data transferred.

Present FIG. 6 merely particular a desired representation of such component 150, and is not intended as representing any particular relationship thereof to the representation of present FIG. 5. In other words, preferably component 150 will not appear within the design field until it is automatically entered into such so as to be automatically and correctly mated with its corresponding primary component. Such mating step (completed) is shown in present FIG. 7, wherein component 132 and component 150 have been automatically mated, as would preferably be illustrated on a monitor means, if utilized with practice of the invention. Such automatic entry is facilitated by entry of component 150 such that its CAD insertion point is made coexistent with the selected accessory attachment point of component 132 (if more than one accessory attachment point is present for such primary component). Through practice of the present invention, both primary and accessory components may be swiftly selected and automatically entered into the design being produced within the given design field.

Additionally, even though considerable dimensional details are present in the design system, and may be represented on a monitor means, there is adequate space for designating legends or the like, such as in areas 154 and 156, so that if desired labeling may be automatically incorporated into the design field with no additional user effort. If such legends were desired, they would preferably be incorporated into the stored information within the electronic catalog or memory means, for automatically being transferred to the design field with other information concerning the selected components.

Since present FIG. 7 also represents an illustration as would be viewed by a user on a monitor means, after entry of both the primary and accessory components, it should be well understood by those of ordinary skill in the art that conventional software within the computer process comprising a CAD system within which the present invention operates, could be used in order to determine distances between selected points on the drawing. Hence, through practice of the present invention, dimensional details of the design may subsequently be analyzed with tremendous efficiency, as well as with an extremely high degree of accuracy, which as noted above may be critical in many if not most design applications.

If desired, similar to inclusion of legend information 154 and 156, dimensional data (such as exterior dimensions) could also be directly transferred from the electronic catalog to the design, and illustrated adjacent the entered components with a monitor means.

Figure 8:
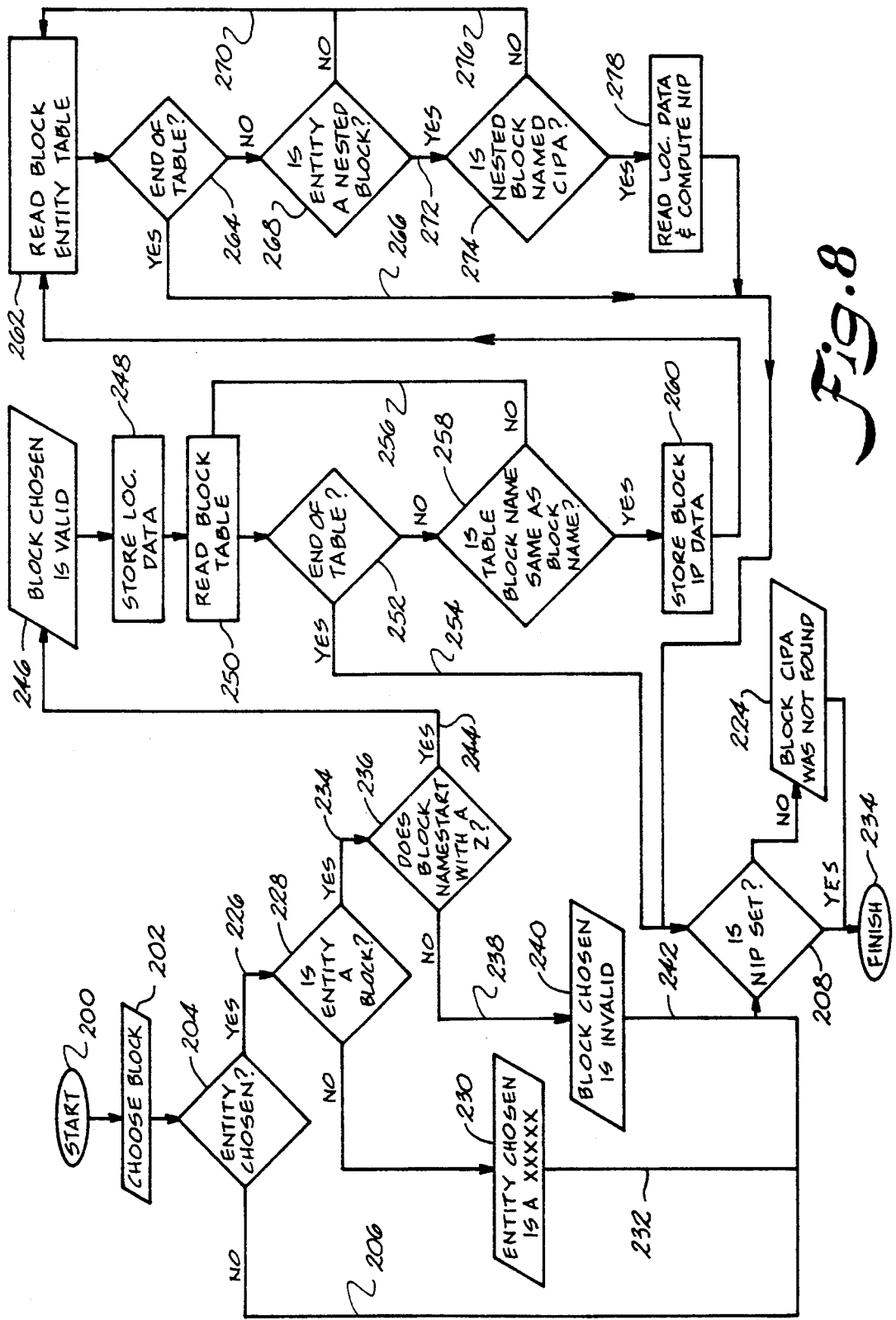
FIG. 8 is a flow chart showing exemplary generalized components steps in accordance with the present invention for performing the automatic combination of a selected accessory component (such as that of present FIG. 6) in mating relationship with a previously selected primary component (such as that of present FIG. 5)
Figure 9:
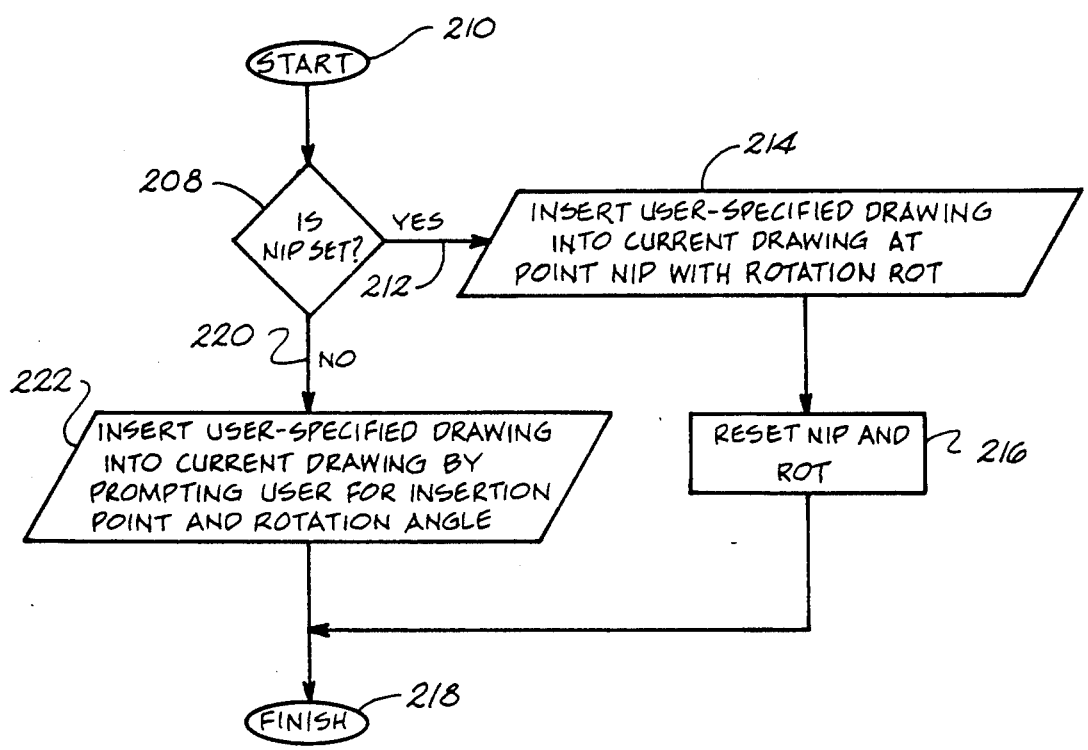
FIG. 9 illustrates a flow chart showing certain generalized aspects of the automatic combination functions performed with reference to the generalized flow chart of present FIG. 8.

While the foregoing disclosure covers in detail exemplary embodiments of the present invention with reference to the perspective of the designer practicing the present invention, the following discussion with reference to present FIGS. 8 and 9 more particularly concerns detailed exemplary operation of microprocessor means in accordance with this invention. In connection therewith, it is noted that actual programming of any microprocessor means is generally regarded herewith as within the abilities of one of ordinary skill in the art, particularly upon receipt of the enabling disclosure herewith as concerns the present invention generally. More particularly, specific operational details for any microprocessor means is needed generally only in connection with the present mount accessory features, or actual automatic entry of either a primary component or accessory component into the given design field. Thus, present FIG. 8 comprises a generalized flow chart pertaining to the mount accessory feature of the present invention, and FIG. 9 more generally relates to features of the present invention pertaining to automatic entry of either a primary component or accessory component into the design field.

Certain aspects of present FIG. 8 are at least in part included because the present invention may optionally be practiced within a computer process such as a CAD system. Hence, certain of the steps included in present FIG. 8 are intended to avoid interference with operation of such other system, and to facilitate design assistance to such system, as is one of the present objects.

Referring more specifically to FIG. 8, the logic required for marrying two components together properly, i.e. performing the automatic entry of an accessory component, or mount accessory feature, is provided. Starting at entry 200, a "block" is chosen in step 202. In this instance "block" broadly means a component such as illustrated on the monitor means, or some other CAD system entity for a group of lines, circles, text, etc. Hence, the terminology "block" has meaning with reference to the CAD system, as well as the present invention. When practicing the present invention, selection of a block refers to designation of or specifying the stored information for a particular respective product component or a family of components.

As referenced above, in order to avoid interference with operation of the CAD system, the preferred first step after step 202 is to verify that a block has been chosen. Test point 204 performs such verification. If verification is negative, pathway 206 is followed to a further test point 208, which refers to whether "NIP" is set. The NIP point constitutes the X-Y coordinates for an accessory attachment point, which is where the pre-assigned CAD insertion point of such accessory component will be placed for mating an accessory component to a primary component. As is represented in present FIG. 8, there are numerous pathways leading to test point 208. If pathway 206 is taken to test point 208, it is likely that an error has been committed or some incorrect piece of data has been entered or selected, wherefore further processing will take place, as illustrated in greater detail with reference to present FIG. 9.

With reference to such FIG. 9, entry into decision point 208 is presumed for purposes of discussion through general designation of a start point 210. If information regarding "NIP" is available (i.e., is NIP set ?), then the affirmative pathway 212 results in completion of step 214. As stated in FIG. 9, operation of step 214 results in insertion of a user-specified drawing (i.e. a component) into the given design field at the designated NIP point with an indicated rotation ROT. Once such is accomplished, both NIP and ROT may be reset in step 216, for receipt of subsequent values. Thereafter, exit through finish step 218 may be taken, since automatic entry of either a primary component or accessory component will have been completed.

Assuming a negative response to test point 208, pathway 220 is followed, whereby during step 222 a user is prompted for specifying an insertion point and rotation angle so that a user-specified component may be thereafter automatically entered into the design field. Upon completion of step 222, exit 218 may again be taken.

Returning to present FIG. 8, test point 208 is also associated in another sense, in its negative output, with an operation block 224 relating to the fact that a block "CIPA" was not found. CIPA is terminology which refers to CAD Insertion Point for Accessories, and constitutes the proper insertion point for an accessory component to be inserted. A fuller meaning and the derivation of such is discussed hereinafter with reference to the remainder of present FIG. 8.

Returning to test point 204, it may be seen that further safeguards are practiced for avoiding interference with operation of the CAD system. If the affirmative pathway 226 is followed, a test point 228 is encountered to question whether the entity involved is a block, in accordance with the term as it is defined above. If not, then operation 230 recognizes that the entity chosen is a "XXXXX" representing lines, circles, text, dimensions, or some other elements from the CAD system, designation and entry into the design field of which should be handled directly in the CAD computer process. Hence, to avoid any possible interference with such CAD system, pathway 232 is followed, ultimately resulting in exit via finish step 234, as discussed generally above.

If affirmative pathway 234 results from test point 228, a further test point 236 is encountered to be certain that the block which is present starts with an arbitrarily selected value, such as "Z". Such test may optionally be practiced to determine whether the block chosen is invalid. For example, if all blocks comprising information corresponding with components stored in the present electronic catalog or memory means start with "Z," then a negative resulting pathway 238 from test point 236 indicates that the block chosen is invalid (operation 240). If an invalid block is chosen, again it is desirable that a pathway 242 ultimately lead to exit via finish step 234. If, on the other hand, affirmative pathway 244 is followed after completion of test point 236, it is known from operation 246 that the block chosen is valid. After such point, operation of the present invention moves forward towards completion of automatic entry of the accessory component in the proper location and orientation for mating with the previously selected and automatically entered primary component.

After determining that the block selected is valid, information is retrieved from the electronic catalog or the memory means in operation 248, and stored such as in the machine memory 70 of the present FIG. 1B. By being stored in a particular section of memory in a more active area, the present invention may be efficiently performed. Such block may include a plurality of different sizes, views, etc. relating to the component information described above. Such information includes the detailed dimensional data referenced above, as well as any assigned CAD insertion points, accessory attachment points, etc. Thereafter, operation 250 is performed for reading the block of information, which is preferably stored in a table of information within the CAD system. Again, to facilitate operation of the present invention within a larger CAD system, test point 252 insures that the desired block is encountered and read prior to reaching the end of the table. If the end of the table is found without finding the block, then pathway 254 is followed, with the potential exit results associated with test point 208, as discussed above. In effect, operation of the invention is such that it tends to fall out of the present system back into the larger CAD system if the desired block is not found within the table, an unlikely event once it has been determined that a valid block has been chosen. Loop 256 associated with test point 258 merely functions to progressively work through the table to find and read the desired block of information.

Once the desired block is found and read, operation of the present invention begins to find out more detailed information about such block, as represented by operation 260 of present FIG. 8. The "IP" data referred to in such operation is the actual dimensional values needed for relating information from prior drawing sessions to the "active" drawing, which is the component being entered into the given design field. Such information comprises a collection of mathematical points that are related to the prior drawing session where the prior design features were produced. Since such prior material is no longer "active", only the component to be added is regarded as active within the design field. Operation 260 involves determining where in space is the CAD insertion point relative to the previously produced design material. Once the original point in such prior drawing material is located, the proper calculations of distances between such point and the later mathematical points describing the component being newly added, as well as the rotation of such, may be performed.

Subsequent to performance of operation 260, operation 262 involves reading the block entity table, during which the X-Y coordinates of the accessory attachment point may be determined. In trying to determine such information, again as a safety valve a test point 264 is provided which set operation of the present invention towards an exit or return to the CAD program via pathway 266 if the necessary block entity information is not encountered. If the necessary information is encountered, it is necessary to determine that the entity information comprises a nested block (test point 268), which is how an accessory attachment point is stored in association with or relationship to the component which is being operated upon. The negative pathway 270 from test point 268 merely establishes a loop to operation 262, until the entity which is read constitutes a nested block. Once an entity constituting a nested block has been obtained (the affirmative pathway 272 from test point 268), a subsequent test point 274 is performed to determine whether the nested block comprises a specific value named "CIPA" (as referenced above). Again, if test point 274 results in negative pathway 276, operation 262 is again repeated. If in the affirmative, then operation 278 is performed, resulting in computation of "NIP" in association with reading the location data obtained in operational step 248.

It is preferably during, or just subsequent to, this portion of operating or executing the present invention that restrictive checks may be made or introduced, to prevent selection of impractical or otherwise invalid accessory components for mating with a previously selected and entered primary component. In such manner, components which do not match up may be prevented from being put together.

Once operation 278 is completed (subject to any additional restrictive features just referenced), test point 208 is again performed. However, on such occasion, NIP should be set, and automatic entry of an accessory component into mating position and orientation with a previously entered primary component may take place, such as for example represented in present FIG. 7 with primary component 132 and accessory component 150.

With an overview to present FIG. 8, one of ordinary skill in the art should understand that the illustrated function of mounting an accessory is performed generally by automatically retrieving preassigned information associated with the selected accessory component, and using same in relation to information regarding the previously produced design within the design field, in order to marry the accessory component properly and automatically to such prior designs within the design field. While such function is preferably performed automatically from the perspective of the system user, it should be understood that a finite amount of time may be involved before automatic entry of the accessory component is made, particularly if the table being considered, such as in operations 250 and 252, is somewhat lengthy and the block of information therein is further down within the table. Similarly, the overview of operation of FIG. 9 is that components A and B are automatically married together, and then the values of NIP and rotation angle are reset so that a second component never appears where the first one was placed, which prevents someone from putting two components directly on top of each other.

Further features may be practiced in accordance with the present invention. For example, it is to be understood that through the method and process of the present invention, entered components may be removed at any point, such as through operation of standard erase features, or the like, to permit subsequent re-placement of the component, or substitution of a different component for that which is removed. Removal or "stripping" of particular components is not limited by the order within which they are initially added to the design field. Likewise, particularly after its entry into the design field, the resulting added components may be scaled in size upward or downward to otherwise accomplish design manipulations desired by the system user.

To provide yet another perspective on the present features relating to automatic entry of an accessory component into the design field, it should be appreciated that operation 260 of present FIG. 8 relates to operation of the present invention at the beginning of analysis or treatment of the data obtained regarding a selected accessory component. In particular, during such operation specific insertion point data is identified in a graphic sense so that location of such insertion point begins to be understood and known to the system. Then, subsequently in operation 278, such information is used in comparison with the information (collection of mathematical points) describing the existing design produced within the design field (the design previously produced with the CAD system, or with addition of a primary component thereto), so that the accessory component and the "prior drawing" may be properly mated together.

In operation 278, the distance between the CAD insertion point and the accessory attachment point is computed, together with the necessary rotation angle, from which information the location data retrieved in operation 248 is used to actually compute where the accessory attachment point X-Y coordinates are located in the design field. Therefore, the only information regarding the added component which is needed is its insertion point and the rotation angle. All other data points may be calculated from such information, in comparison with the "prior drawing" information and the dimensional data for such component. The location of such accessory attachment point is referred to an "NIP" in the overview of present FIG. 8. Once such location NIP is exactly known, and it is known from the location data obtained in operation 248 how the block is oriented in space, necessary computations may take place.

At present, the simplest scale manipulations are done after particular components are entered into the design field, so that the entire design field may be collectively scaled at a particular time.

To generally summarize, based on the "prior drawing" information, as well as information obtained about the selected accessory component, the X-Y location within the design space where the accessory component is to be attached is calculated together with the rotation angle thereof, and all other mathematical points describing such accessory component are calculated therefrom. Accordingly, various objects of the present invention are advantageously achieved, such as automatic transference of detailed dimensional data with great accuracy, and automatic marrying of accessory components with previously entered primary components. Practice of the present invention is not limited to use of any particular computation in determining where such NIP values should be, since different approaches may be practiced, and various means, such as specifically programmed microprocessor means, or firmware applications, or others, may be practiced for executing the transformations called for.

Another possibility with the present invention is to permit mounting plural accessory components to a single primary component at different locations thereof. In such instance, a particular component could have different accessory attachment point possibilities, such as CIPA, or CIPB, etc. In such instance, the selection procedure would also involve specification of a particular accessory attachment point for automatic mating thereto of a subsequently or concurrently selected accessory component. All such variations are intended to come within the broader spirit and scope of the present invention, by virtue of present reference thereto.

As referenced above, the present invention may be practiced as either apparatus (system) or method (process) and applied to numerous different technical fields. Even within the field of power transmission design, numerous other families of products, other than the exemplary reducers and motors illustrated above, may be practiced. A partial list of such various alternatives include gearmotors, reducers, mounted ball bearings, roller bearings, conveyor components for different types of conveyors, shaft coupling mechanisms, fractional horsepower V-drives, sleeve bearings of various types, tapered roller bearings, spherical roller bearings, sheaves, right angle reducers, concentric reducers, shaft reducers, screw conveyor drives, APG gear reducers, and C-face motors. Moreover, such components may comprise specific commercially-available embodiments (such as designated by brand name, model number, etc.) or various generic representations which may be provided and used such as for initial insertion into a design until a particular brand name component is designated.

Furthermore, while the forgoing description has not been discussed in every possible detail, numerous variations to the present methods and processes which would occur simply by altering the performance order of various present steps, or introducing alternative steps thereto, and all such variations and modifications are intended to come within the spirit and scope of the present invention. For example, "stripping" of previously entered components, or other such corrections, are intended to be included aspects of the present invention, generally regardless at which point during a method they are practiced.

Similarly, it is expected that those of ordinary skill in the art may practice various hardware configurations during the course of practicing the present invention, all of which is intended to come within the spirit and scope of this invention. For example, certain aspects of the present computer processes may be provided in software, while portions or all thereof may be variously alternatively provided in firmware, or other possible equivalents. Likewise, other variations may be practiced, such as utilizing contrasting colors for component representations versus insertion point and accessory attachment point assignments thereon. Likewise, parameters for restricting the selection of particular accessory or primary components, may be varied by individual users in given circumstances, to accommodate their particular suits and needs. It is also anticipated that users may variously avail themselves of the detailed dimensional data which may be brought into the design field through operation of the present invention. For example, conventional software may be used to extract dimensions, differences, etc. as to features within the design field, after entry of the components thereto.

It is further to be understood that the electronic catalog or memory means of particular component information may be recorded and provided in numerous different ways, and likewise may be updated in various fashions. Even modem-connected networks are encompassed by the present reference to electronic catalog systems or memory means.

It is also to be further understood by those of ordinary skill in the art that the foregoing description of exemplary preferred embodiments, and specifics thereof, is intended by way of example only, and that such is not intended to limit the present invention which is further set forth in the appended claims.

What is claimed is:

1. A process for operating a computeraided design system, such as having microprocessor means, memory means, and monitor means for producing designs in a given design field, said process comprising:

storing in said memory mean a plurality of respective graphics form representations of a plurality of respective physical product components for possible use in a given design produced within said given design field, including assigning a predesignated CAD insertion point on each respective representation;

specifying to said microprocessor means a particular respective product component graphics form representation to be extracted from said memory means;

indicating a field point within said design field where said CAD insertion point of said specified graphics form representation of said particular product component is to be inserted into the design being produced;

determining a rotation angle for said specified graphics form representation of said particular product component about its CAD insertion point;

thereafter automatically entering said specified graphics form representation of said particular product component into said design field, with said CAD insertion point thereof positioned in said given design field at said field point indicated therein, and with said specified graphics form representation rotated at said determined rotation angle about its CAD insertion point;

whereby a graphics form representation of a desired product component may be selected and automatically positioned within the design being produced in the given design field with minimized user manipulations; and wherein said product components comprise primary components, and wherein said storing step includes assigning a predesignated accessory attachment point on each graphics form representation of each respective primary component, whereby accessory components may be attached thereto at such accessory attachment point for joining such respective primary component and an accessory component in a given design being produced within a given design field.

2. A process as in claim 1, wherein said storing step includes storing at least certain of the graphics form representation in designated families, and said specifying step includes selecting from said memory means a family of related components, which family includes a plurality f respective components of differing types and/or sizes within such family.

3. A process as in claim 2, wherein said specifying step includes selecting within said family an individual respective component of a particular type and size.

4. A process as in claim 3, wherein said specifying step further includes selecting a particular view of the selected individual respective component.

5. A process as in claim 1, wherein said design being produced is for a power transmission application.

6. A process as in claim 1, wherein said computeraided design system further includes output means for outputting a hard copy drawing of the design produced within said design field, and wherein said process further includes the step of outputting a hard copy drawing of the design produced within said design field.

7. A process as in claim 2, further including:
storing in said memory means a plurality of respective graphics form representations for respective physical accessory components for possible mating with specified primary components in a given design being produced within said given design field, including assigning a predesignated CAD insertion point on each respective graphics form representation;
after automatic entry of the specified primary component into said design field, specifying to said microprocessor means a particular respective graphics form representation for each respective accessory component to be extracted from said memory means; and
thereafter automatically entering said specified graphics form representation of an accessory component into said design field, with said CAD insertion point thereof positioned coexistent with said predesignated accessory attachment point of the graphics form representation of said specified primary component, and with relative rotation of said accessory component representation relative said CAD insertion point thereof automatically determined in accordance with the operative relationship between the specified primary component and the specified accessory component;
whereby the graphics form representation of said specified accessory component is automatically mated with the graphics form representation of said specified primary component in the design being produced.

8. A process as in claim 7, wherein said storing step includes storing at least certain of the graphics form representation for the accessory components in designated families, and said accessory component specifying step includes selecting from said memory means a family of related accessory components, which family includes a plurality of respective accessory components of differing types and/or sizes within such family.

9. A process as in claim 8, wherein said accessory component specifying step further includes selecting within said family an individual respective accessory component of a particular type and size.

10. A process as in claim 7, wherein said accessory component specifying step is restricted to selection of only accessory components which are operative with the primary component to which they are to be mated.

11. A process as in claim 7, wherein:
said storing step includes assigning more than one predesignated accessory attachment point to graphics form representations for certain of the respective primary components; and
said process further includes an intermediate step of designating a particular one of such multiple accessory attachment points for a specified primary component as a target for mating of an accessory component representation CAD insertion point thereto.

12. A process as in claim 7, wherein said storing step includes storing dimensional data for each of the respective graphics form representations.

13. A computer-aided design system for producing designs in a given field, said system comprising:
memory means for storing a plurality of respective graphics form representations of a plurality of respective physical product components for possible use in a given design produced within said given design field, including assigning a predesignated CAD insertion point on each respective representation;
microprocessor means, operatively associated with said memory means, for specifying under user-control a particular respective product component graphics form representation to be extracted from said memory means, including indicating a field point within said design field where said CAD insertion point of said specified graphics form representation of said particular product component is to be inserted into the design being produced, determining a rotation angle for said specified graphics form representation of said particular product component about its CAD insertion point, and thereafter automatically entering said specified graphics form representation of said particular product component into said design field, with said CAD insertion point thereof positioned in said given design field at said field point indicated therein, and with said specified graphics form representation rotated at said determined rotation angle about its CAD insertion point;
whereby a graphics form representation of a desired product component may be selected and automatically positioned within said design being produced in the given design field with minimized user manipulations and,
wherein said product components comprise primary components, and wherein said memory means include stored therein an assigned predesignated accessory attachment point on each graphics form representation of each respective primary component, whereby accessory components may be attached thereto at such accessory attachment point for joining such respective primary component and an accessory component in a given design being produced within a given design field.

14. A system as is claim 13, wherein said memory means includes therein graphics form representation of components stored in family designations, and said microprocessor means is further operative under user-control for selecting from said memory means a family of related components, which family includes a plurality of respective components of differing types and/or sizes within such family.

15. A system as in claim 14, wherein said microprocessor means is further operative for selecting within said family an individual respective component of a particular type and size.

16. A system as in claim 15, wherein said memory means includes therein respective plural views of each respective stored component, and said microprocessor means is further operative under user-control for selecting a particular stored view of the selected individual respective component.

17. A system as in claim 13, further including output means for outputting a hard copy drawing of the design produced within said design field.

18. A system as in claim 13, wherein:

said memory means includes stored therein a plurality of respective graphics form representations for respective physical accessory components for possible mating with specified primary components in a given design being produced within said given design field, including having an assigned predesignated CAD insertion point on each respective graphics form representation;

after automatic entry of the specified primary component into said design field, said microprocessor means is operative under user-control for specifying a particular respective graphics form representation for each respective accessory component to be extracted from said memory means, and thereafter for automatically entering said specified graphics form representation of an accessory component into said design field, with said CAD insertion point thereof positioned co-existent with said predesignated accessory attachment point of the graphics form representation of said specified primary component, and with relative rotation of said accessory component representation relative said CAD insertion point thereof automatically determined n accordance with the operative relationship between the specified primary component and the specified accessory component;

whereby the graphics form representation of said specified accessory component is automatically mated with the graphics form representation of said specified primary component in the design being produced.

19. A system as in claim 18, wherein said memory means includes graphics form representations for at least certain of the accessory components stored therein in family designation, and further includes stored therein respective plural views of each respective stored component, and said microprocessor means is further operative under user-control for initially selecting from said memory means a family of related accessory components, which family includes a plurality of respective accessory components of differing types and/or sizes within such family, and for subsequently selecting within said family an individual respective accessory component of a particular type and size.

20. A system as in claim 18, wherein said microprocessor means is operative for restricting specifying accessory components to only those which are operative with the primary component to which they are to be mated.

21. A system as in claim 18, wherein:

said memory means includes stored therein more than one assigned predesignated accessory attachment point for graphics form representations for certain of the respective primary components; and said microprocessor means is operative under user control for designating a particular one of such multiple accessory attachment points for a specified primary component as a target for mating of an accessory component representation CAD insertion point thereto.

22. A system as in claim 18, wherein said memory means includes stored therein dimensional data for each of the respective graphics form representations.

23. An electronic template system for aiding a system user in producing computer-generated designs, comprising:

an electronic catalog of information concerning predetermined primary physical components for selected usage in a design being produced, said catalog including a graphics form representation and corresponding dimensional data for each respective primary component and a location of a predefined insertion point on each component representation;

microprocessor means, operatively associated with said electronic catalog, for selectively withdrawing primary component information therefrom for use in a given design being produced;

wherein said microprocessor means is operative for being commanded by a system user so as to select a desired primary component, and thereafter automatically enter said graphics form representation of same into the design, with such desired primary component representation entered with the predefined insertion point thereof located at a user-designated field point in the design, and with such desired primary component representation situated in a user-designated rotation about its predefined insertion point;

wherein said electronic catalog further includes precoded target means associated with each primary component representation, for permitting acquisition of graphics form representation of accessory components at such target means; and wherein said electronic catalog further includes information concerning accessory components for selected usage in a design being produce, said catalog including a graphics form representation and corresponding dimensional data for each respective accessory component and a location of a predefined insertion point on each accessory component representation; and said microprocessor means is operative for being commanded by a system user so as to select a desired accessory component, and thereafter automatically enter said graphics from representation of same into the design, with such desired accessory component representation entered with the predefined insertion point thereof located at the precoded target means for the primary component representation with which such accessory component representation is to mate.

24. A system as in claim 23, further including monitor means, operatively associated with said microprocessor means, for permitting a suer of said electronic template system to observe a design being produced, including observation of entries thereto of graphics form component representations.

25. A method of operating an electronic template system for aiding a system user in producing computer-generated designs, comprising:

providing an electronic catalog of information concerning predetermined primary physical components for selected usage in a design being produced, said catalog including a graphics form representation and corresponding dimensional data for each respective primary component and a location of a predefined insertion point on each component representation;

providing microprocessor means, operatively associated with said electronic catalog, for selectively withdrawing primary component information therefrom for use in a given design being produced;

operating said microprocessor means under system user control so as to designate desired position and orientation for a desired primary component representation, whereby said microprocessor means is operative so as to select a desired primary component from said electronic catalog, and thereafter automatically enter said graphics form representation of same into the design, with such desired primary component representation entered with the predefined insertion point thereof located at a user-designated field point in the design, and with such desired primary component representation situated in a user-designated rotation about its predefined insertion point;

said electronic catalog further including precoded target means associated with each primary component representation, for permitting acquisition of graphics form representations of accessory components at such target means; and wherein said electronic catalog further includes information concerning accessory components for selected usage in a design being produced, said catalog including a graphics form representation and corresponding dimensional data for each respective component and a location of a predefined insertion point on each accessory component representation; and said microprocessor means is operated by a system user so as to select a desired accessory component, and thereafter automatically enter said graphics form representation of same into the design, with such desired accessory component representation entered with the predefined insertion point thereof located at the precoded target means for the primary component representation with which such accessory component representation is to mate.

26. A method as in claim 25, further including providing monitor means, operatively associated with said microprocessor means, for permitting a user of said electronic template system to observe a design being produced therewith, including observation of entries thereto of graphics form component representations.

27. A method as in claim 25, wherein:

said catalog includes plural precoded target means for at least certain of said primary component representation; and said microprocessor means is operated by a system user prior to entering said accessory component representation to the design, so as to select a particular one of plural precoded target means to which the accessory component representation predefined insertion point is to be mated.

28. An automatic component-matching design assistance system for operation within a computer process comprising a computer-aided design system including microprocessor means, for producing a design within a design field, said design assistance system including:

an electronically stored catalog of a plurality of graphics form representations of respective physical primary components and accessory components with dimensional data stored for each of the respective components, and with a predefined insertion point assigned on each component representation, and a predefined accessory attachment point assigned on each primary component representation;

mans operative with said microprocessor means and under user direction for selecting from said catalog a desired respective primary component, and entering the graphics form representation of said into the design field with said predefined insertion point of such primary component representation situated at a user-designated position in the design field, and with such primary component representation oriented at a user-designated rotation angle about its predefined insertion point; and further including means operative with said microprocessor means and under user direction for selecting form said catalog a desired respective accessory component, and for entering the graphics form representation of the selected accessory component into the design field with the location of said predefined insertion point of such accessory component representation automatically mated to the predefined accessory attachment point of the primary component representation, and with a predetermined rotation angle between such component representations.

29. A computer process for automatic component-matching design assistance for operation within a computer aided design system including microprocessor means, for producing a design within a design field, said computer process including:

providing an electronically stored catalog of a plurality of graphics form representations of respective physical primary components and accessory components with dimensional data stored of each of the respective components, and with a predefined insertion point assigned on each component representation, and a predefined accessory attachment point assigned on each primary component representation;

operating said microprocessor means under user direction for selecting from said catalog a desired respective primary component, and entering the graphics form representation of same into the design field with said predefined insertion point of such primary component representation situated at a user-designated position in the design field, and with such primary component representation oriented at a user-designated rotation angle about its predefined insertion point; and further including operating said microprocessor means under user direction for selecting from said catalog a desired respective accessory component, and for entering the graphics form representation of the selected accessory component into the design field with the location of said predefined insertion point of such accessory component representation automatically mated to the predefined accessory attachment point of the primary component representation, and with a predetermined rotation angle between such component representations.

* * * * *

UNITED STATES PATENT AND TRADEMARK OFFICE
CERTIFICATE OF CORRECTION

PATENT NO. : 5,165,015
DATED : November 17, 1992
INVENTOR(S) : COGGINS

It is certified that error appears in the above-indentified patent and that said Letters Patent is hereby corrected as shown below:

Column 18, Claim 2, line 6, change "f" to --of--.

Column 24, Claim 28, line 5, Change "mans" to --means--.

Signed and Sealed this

Twenty-ninth Day of March, 1994

Attest:

BRUCE LEHMAN

*Attesting Officer*     *Commissioner of Patents and Trademarks*